(12) United States Patent
Nelson

(10) Patent No.: US 11,201,314 B2
(45) Date of Patent: Dec. 14, 2021

(54) LOW ONSET GAIN SATURATION OLED

(71) Applicant: Mitchell C. Nelson, Rehoboth Beach, DE (US)

(72) Inventor: Mitchell C. Nelson, Rehoboth Beach, DE (US)

(*) Notice: Subject to any disclaimer, the term of this patent is extended or adjusted under 35 U.S.C. 154(b) by 166 days.

(21) Appl. No.: 16/585,952

(22) Filed: Sep. 27, 2019

(65) Prior Publication Data

US 2020/0106052 A1 Apr. 2, 2020

Related U.S. Application Data

(60) Provisional application No. 62/737,826, filed on Sep. 27, 2018, provisional application No. 62/785,920, filed on Dec. 28, 2018, provisional application No. 62/804,528, filed on Feb. 12, 2019, provisional application No. 62/832,315, filed on Apr. 11, 2019.

(51) Int. Cl.
*H01L 51/52* (2006.01)

(52) U.S. Cl.
CPC ...... *H01L 51/5265* (2013.01); *H01L 51/5206* (2013.01); *H01L 51/5218* (2013.01); *H01L 51/5221* (2013.01); *H01L 2251/301* (2013.01); *H01L 2251/558* (2013.01)

(58) Field of Classification Search
CPC ............. H01L 51/5206; H01L 51/5218; H01L 51/5221; H01L 51/5265
See application file for complete search history.

(56) References Cited

U.S. PATENT DOCUMENTS 8,432,546 B2 * 4/2013 Frankel ..................... G01J 3/44
356/328

* cited by examiner

*Primary Examiner* — Suberr L Chi
(74) *Attorney, Agent, or Firm* — Law Offices of Mitchell P. Novick

(57) ABSTRACT

Embodiments of this invention relate to and, more particularly, to solid state lighting, digital displays, conversion of electrical energy to light, low onset gain saturated stimulate emission, light production with high efficiency and high output per area, and light production while limiting material degradation, and may also be applied in optical or quantum information processing and networking. Embodimenta of this invention comprise spectroscopic configurations having a radiative transition to a depopulated state and an optical configuration having sufficient Q such that the combination allows onset of gain saturation with a small excited state population or low current density, thus enabling production of light in a mode with near total output coupling, high efficiency, high output, low roll-off and attenuation of losses and degradation processes.

11 Claims, 17 Drawing Sheets

LOW ONSET GAIN SATURATION OLED

CROSS-REFERENCES TO RELATED APPLICATIONS

This application claims the benefit of:
(1) U.S. Provisional Application For Patent Ser. No.: 62/737,826, filed Sep. 27, 2018;
(2) U.S. Provisional Application For Patent Ser. No.: 62/785,920, filed Dec. 28, 2018;
(3) U.S. Provisional Application For Patent Ser. No.: 62/804,528, filed Feb. 12, 2019; and
(4) U.S. Provisional Utility Patent Application Ser. No. 62/832,315, filed Apr. 11, 2019;
and whose contents are incorporated by reference herein in their entirety.

FIELD OF THE INVENTION

Embodiments of this invention relate to and, more particularly, to solid state lighting, digital displays, organic thin film lasers, and conversion of electrical energy to light.

BACKGROUND OF THE INVENTION

Lighting represents roughly 7% of the world's carbon footprint. Much of the world still burns paraffin or kerosene for light, and thus producing light cleanly and efficiently is import for both climate issues and global economic equality and opportunity. In devices for portable computing, cell phones, tablets, etc, the display can represent 50% of the power use, and thus 50% of the battery requirement.

Prior art technology for producing light, whether for lighting or for displays, is inefficient compared to theoretical limits for efficiency, and in organic light emitting devices there are further problems in being unable to produce adequate light per area of source to be able to replace legacy lighting devices, and in the operating lifetime of the devices.

Traditional incandescent lighting provides order of 8 lm/watt. Fluorescent lights, for example CFL's provide order 100 lm/W. The best of the solid state lighting ("SSL") devices—light emitting diode ("LED") devices, and organic light emitting diode ("OLED") devices—claim or promise 200 lm/w and sometimes more.

Because of its promised efficiency, SSL is widely looked to as a means of reducing the global carbon footprint related to producing light. Moreover, improved efficiency in producing light can provide further environmental and cost benefits by reducing requirements for batteries or other power sources and infrastructure and by offering extended lifetimes for lighting elements. But, much of the promise and potential of SSL has not been realized. Practical LED devices, and OLED devices, exhibit pronounced efficiency roll-off and consequently typically top out at an external efficiency of about 10% to 20%. Current best art commercial LED devices may produce 200 lm/W at turn on, but produce only 67 lm/W at operating power levels. The large heat sinks found in conventional LEDs attest to their inefficiency, and efficiency roll-off in LEDs is known to increase with temperature. The industry mitigates these issues by placing multiple LED elements in a single lighting unit, such as a LED bulb, so as to operate each LED element at reduced power.

In practice, OLEDs, including related electroluminescent, technology typically provides 40 lm/W, but only sustains currents in the range of 1-10 mA/cm$^2$; consequently, output per area is severely limited. Further, because OLED technology involves reactive and quenchable charged and excited state species, increasing power in OLEDs translates directly to decreasing efficiency and lifetime.

OLED display devices are further challenged to produce blue, consequently the blue pixel is usually large. LED and OLED displays suffer the same issues as do LED and OLED lighting.

The prominent challenges in OLEDs include light extraction, with 80% of light production loss to transverse modes and waveguiding, efficiency roll-off due to quenching by charge and other various species, and degradation, driven largely by charge- and photo-chemistry, again often involving the excited state population. Degradation is especially problematic in blue emitters, TADF emitters, and some host materials. As a consequence of these and other issues, OLED devices operate with modest or low efficiency and at low current density, so that in the prior art, large area panels have been the only practical formats for OLED lighting. OLEDs offer superior color rendering compared to LCD and LED displays, but require larger blue pixels to accommodate low efficiency and output.

Stimulated emission has long been a goal among OLED researchers that is expected to substantially address these issues. Stimulated emission is a process in which a photon stimulates the emission of a second photon in the same optical mode as the first photon, accompanied by a transition from an upper energy level to a lower energy level.

Stimulated emission occurs alongside absorption and spontaneous emission. The rate constants for these three processes are related to each other by a set of relations described for the Einstein A and B coefficients.

A is the rate coefficient for spontaneous emission of light accompanied by a transition by an excited state species to a lower energy state.

B is the coefficient for absorption of light with a transition from a lower energy state to a higher energy excited state.

B is also the coefficient for stimulated emission where the photon provokes a transition from a higher energy state to a lower energy state accompanied by the emission of a second, matching photon.

Where one has any one of the three process, spontaneous emission, absorption, and stimulated emission, one has all three processes. However, since the coefficient for absorption is the same as that for stimulated emission, modulo degeneracy factors, stimulated emission is observed only when the population of the upper level is in excess of the population of the lower level, modulo degeneracy factors. This is referred to as a population inversion.

Onset of lasing is typically followed by a phenomenon called gain saturation, where the stimulated emission relaxation path essentially takes over and drains the inversion to a fixed level set by the optical configuration and radiative relaxation rate.

Much of the early history of stimulated emission involved the search for methods for achieving the required population inversion in optically pumped systems. It is readily seen that this is not readily accomplished by simply exciting the same transition as that in which one hopes to see stimulated emission.

In electrically pumped devices, inversion is still a prerequisite to seeing stimulated emission, and in many materials this requires an excited state population greater than 50%. Since the excited state population will also undergo spontaneous emission, and non-radiative relaxation, the large large excited state population required for inversion in this manner will incur a significant electrical input, termed the parasitic current, to offset the radiative and non-radiative losses from the excited state before onset of stimulated emission.

The parasitic current may also be referred to as the parasitic current density, or the onset current, or the onset current density.

In materials where the parasitic current corresponds largely to radiative losses, some reduction in the parasitic current has been achieved by constructing the optical configuration such that the emission of light is forbidden in directions other than the direction of the desired output. This was first proposed and demonstrated using photonic crystals, and has become a mainstay of solid state inorganic lasers.

However, to obtain net stimulated emission, rather than absorption, in any case requires inversion and in conventional inorganic lasers, such as LED lasers, this sets a lower bound on the parasitic current. The minimum excitation required for inversion, and the parasitic current, in turn sets a lower bound on losses, including those resulting in heating, which then further degrade efficiency.

In OLED devices, the formation of a large excited state population is associated with quenching, and can require significant electrical input and formation of a significant population of charged states.

Consequently, having not been able to achieve this goal of stimulated emission in OLEDs, some have argued that onset is not accessible because of quenching processes as output is increased, whether by charge quenching of the excited state or by interaction of an excited state molecules with other molecules in any of various states. These objections assume that onset requires a high level of input and excitation.

Prior OLED devices have not been configured in a manner that enables low onset of gain saturated stimulated emission. For example, a metal such as aluminum that does not form a high reflectance mirror in an OLED is often used as an electrode and mirror, and the cavity length is often one wavelength or less, both of which limit the quality factor of the cavity mode ("Q") to an extent that requires unfeasibly large current density for onset. Q can also be severely limited by using a material inside the cavity that has significant absorption at the wavelength of stimulated emission, whether by the ground state, an excited state, or by a charged state of either. Onset in OLEDS is effectively precluded for a radiative transition where there is a significant population of the lower level of the transition, thus requiring a large excited state population and large onset current.

BRIEF SUMMARY OF THE INVENTION

There are numerous patents in the field of microcavity OLEDs, many of which redundantly claim elements of an OLED inserted in a resonant cavity to different ends. The present invention improves upon previous microcavity devices by comprising a cavity of sufficient Q, provided by a combination of cavity length and reflectance, in resonance with a radiative transition to a depopulated level, so as to provide low onset of gain saturation with a small fixed excited state population.

Embodiments of this invention comprise a new type of OLED, or more broadly, electroluminescent device, that produces light with high efficiency, at near ideal levels, with high output, and extended operating lifetime.

This OLED or device works by producing light through gain saturated stimulated emission in an optical mode, typically the vertical mode which couples light out of the device. This effect is enabled by configuring the device for low onset, meaning onset at low current density, and with a small excited state population.

Embodiments comprise a combination of (a) using a luminescent material having a radiative transition to a sufficiently depopulated lower level, in which depopulation is sufficiently fast, and (b) an optical configuration that provides sufficient Q, or similar property such as modal lifetime, such that onset of gain saturation occurs with a small inversion population, and with a small current density.

Sufficient Q is achieved by a combination of (a) materials or structures providing adequate reflectance and (b) an adequate cavity length. Q is a product of cavity length between the parallel reflecting surfaces and 2Π (pi) over the negative natural logarithm of the product of the reflectances.

Also, materials that are used inside the space between the reflective surfaces, should not substantially reduce Q, for example by having significant optical absorption at the operating wavelength.

Thus, the instant invention includes without limitation, embodiments in (a) an optical and spectroscopic configuration that enables low onset of gain saturated stimulated emission, (b) a device that produces light or laser light with electrical input, (c) a device that produces light or laser light with an optical input, and (d) devices that produce electricity from light.

A benefit of the present invention is that light can be produced with near ideal efficiency with attenuated losses and with attenuated degradation of the emitter and other materials so that the device can operate at high power and have a longer lifetime.

In the present invention, light is produced by gain saturated stimulated emission with onset at low current density and low excited state population by using a radiative transition to a depopulated level combined with a sufficiently high Q. Q is proportional to the photon lifetime of the mode. Generally, the preferred mode is the vertical mode which is the mode that produces output perpendicular to the face of the device. In this way, light production is almost entirely in a mode with close to 100% light extraction, and with high output and high efficiency, and loss processes and degradation processes are attenuated.

Embodiments of this invention relate to and, more particularly, to solid state lighting, digital displays, conversion of electrical energy to light, low onset gain saturated stimulate emission, light production with high efficiency and high output per area, and light production while limiting material degradation, and may also be applied in optical or quantum information processing and networking. Embodiments of this invention comprise spectroscopic configurations having a radiative transition to a depopulated state and an optical configuration having sufficient Q such that the combination allows onset of gain saturation with a small excited state population or low current density, thus enabling production of light in a mode with near total output coupling, high efficiency, high output, low roll-off and attenuation of losses and degradation processes.

The present invention implements choices of materials and structure, including reflectances and cavity length, that were not implemented in any previous device, and when suitably configured, provides onset as low as 10 mA/cm$^2$ and below with external efficiency as high as 90% and above and output as high as 30k cd/cm$^2$ and above.

DETAILED DESCRIPTION OF THE INVENTION

Figure 1:
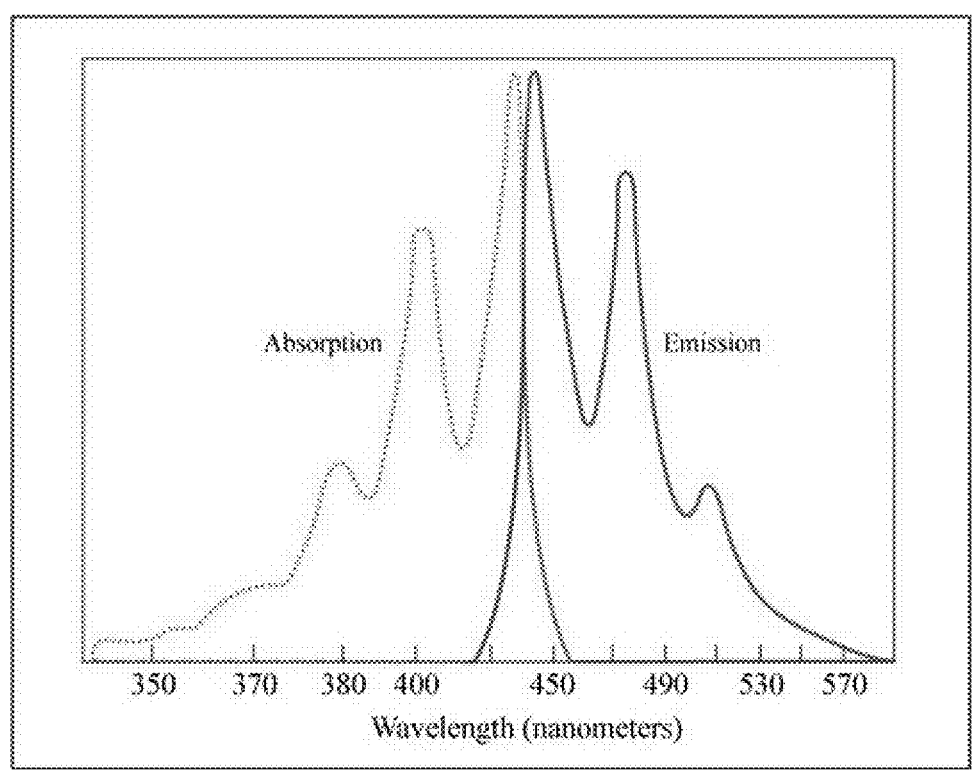
FIG. 1 is a sample of absorption and emission spectra of an emitter.

Overview:

Gain saturated stimulated emission occurs when the stimulated emission path dominates the relation paths in a mode, and results in a substantially fixed level of population inversion.

The gain saturated fixed inversion level can be made small by employing an optical configuration having a sufficiently large Q, and by employing materials that have sufficiently low absorption at the wavelength of light emitted by the stimulated emission.

Gain saturated stimulated emission is made to occur with a small fixed excited state population, by employing a radiative transition for which the lower level is depopulated, in combination with an optical configuration having a sufficiently large Q.

By employing a lower level that is rapidly depopulated, the device can produce light by gain saturated stimulation to a high level of output, limited only by the typically very fast rate of vibrational relaxation and electrical properties.

Accomplishing the required level of depopulation and low onset current density is then a matter of designing the device to have an appropriate emitter affording such a transition, the use of appropriate mirrors to allow for sufficient reflectivity and sufficiently low loss for transmitted light leaving the cavity, in combination with a long enough cavity, and the absence of losses inside the cavity that would compete with stimulated emission.

A benefit of stimulated emission, and more so, gain saturated stimulated emission is that light is produced essentially entirely in a mode. Where that mode is the so-called vertical mode, light extraction is inherently close to 100%. The OLED industry has worked for decades to improve light extraction, typically using elaborately textured substrates and other features. The present invention obviates that issue in entirety.

A benefit of gain saturated stimulated emission with a small excited state population, is that onset can occur at low current density, or at low pump level. The reduces the voltage and charge density at onset and thereby attenuates effects that were previously thought to inhibit onset.

Another benefit of gain saturated stimulated emission with a small excited state population, is that quenching processes and degradation processes are attenuated and remain attenuated as power is increased.

Thus, a benefit of the present invention is that light can be produced with near ideal efficiency with attenuated losses and with attenuated degradation of the emitter and other materials so that the device can operate at high power and have a longer lifetime.

Gain saturation thus provides an operating condition where energy, whether electrical or optical, added to the device after reaching gain saturation, is converted almost entirely into light in a mode, while losses remain essentially constant. While this condition is maintained, the efficiency of the device in effect approaches its ideal limit as power is increased, notably with the exception of heat losses driven by the electrical current in the case of conventional LED lasers.

Molecular materials, and to some extent polymeric materials, offer a different situation. As a result of a Stokes shift and/or Kasha's rule, absorption and emission spectra partially overlap and are near symmetrical opposites of each other around a central wavelength. This creates the possibility of radiative transition to a rapidly depopulated lower energy state level, for example a vibrational excited state in the electronic ground state.

A minimal population inversion for stimulated emission, then corresponds to a small excited state population, minimally in excess of that of the depopulated level. Gain saturation then can produce a fixed inversion that corresponds to a small excited state population minimally in excess of that of the depopulated lower energy level.

For molecular materials, for example organic molecules, Kasha's rule states that relaxation from an electronic state occurs in appreciable yield from the lowest energy vibrational state of that electronic level, to the vibrational levels of the lower electronic energy state for all of the allowed such transitions.

Since the population of a vibrational level within an electronic state, follows a Boltzman distribution, the population of a higher energy vibrational level is exponentially smaller compared to a lower energy vibrational state.

Thus, operating at a wavelength that corresponds to a transition to a suitably high energy vibrational level in the lower electronic state provides the possibility of stimulated emission and then gain saturation, with a small excited state population.

Since the gain saturated inversion, and hence the excited state population in gain saturation, is controlled by the relaxation rate of the radiative transition, and by the cavity lifetime, the second part of the solution to achieving gain saturated emission with a small nearly constant excited state population is to provide an optical configuration with sufficient Q.

Having achieved this goal, onset of gain saturation can proceed at minimum electrical input, and minimum excited state population, thus minimizing higher order losses at onset. Once onset is achieved, these losses remain small as power is added and light output increases nearly exclusively in the vertical mode, thus leading to near ideal efficiency.

A more specific and quantitative description of this invention follows.

An example emitter is shown in FIG. 1. Absorption occurs to shorter wavelengths, emission occurs to longer wavelengths, with partial overlap of the lowest energy absorption and highest energy emission.

Figure 2:
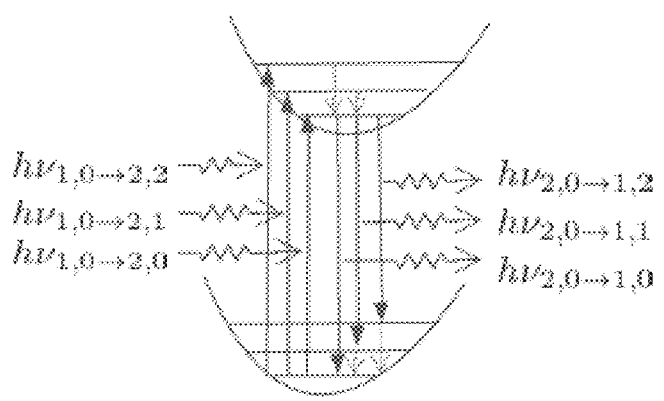
FIG. 2 is a schematic of absorptive and radiative transitions from lowest vibrational level of an electronic state to vibration levels of another electronic state, preceded and followed by vibrational relaxation.

The spectra can be understood in relation to the Jablonski diagram shown in FIG. 2. Following Kasha's rule, absorption occurs primarily from the lowest vibrational state in the lower electronic excited state, to each of the vibrational levels in the electronic excited state. Similarly, relaxation with emission of photons occurs primarily from the lowest vibrational level in the electronic excited state to each of the vibrational levels in the electronic ground state. Notably, vibrational relaxation occurs on a time scale of picoseconds while radiative transitions generally occur on a scale of nanoseconds for fluorescence to microseconds or even milliseconds for phosphorescence.

Figure 3:
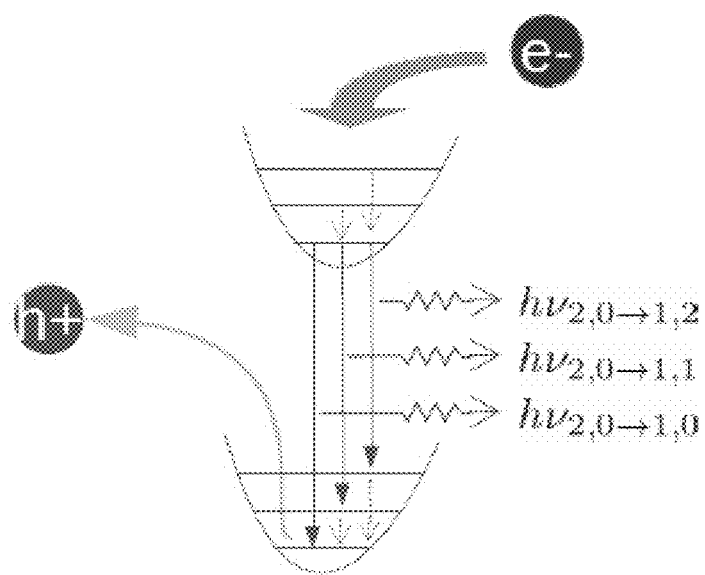
FIG. 3 is a schematic of radiative transitions to vibrational levels in an electronic grounds state, preceded by charge carrier recombination and vibrational relaxation in the electronic excited state, and followed by vibrational relaxation in the electronic ground state.

For an electrically driven device such as an OLED, the process for producing light from electricity by spontaneous emission may proceed as in FIG. 3 where the excited state is formed by electron-hole recombination. Alternatively, recombination can occur on another molecule, for example a host molecule, and then move as an exciton onto an emitter molecule. In either case, Kasha's rule applies and emission proceeds as above, from the lowest vibrational level in the electronic excited state to any of the vibrational levels in the lower electronic level.

It might be noted that both spontaneous emission and stimulated emission, and also absorption, are processes whose rates depend in part on optical boundary conditions. In modern terms, these processes are described in the context of an optical mode of the device by a rate equation, $$\frac{dP_k}{dt} = \beta_k \frac{N_2}{\tau_{sp}} + g_k P_k (N_2 - N_{1,v}) - \frac{P_k}{\tau_k} \qquad \text{(Eq. 1)}$$

where $P_k$ is the photon density in mode k, $\beta_k$ is the fraction of spontaneous emission into mode k, $g_k$ is the coefficient for stimulated emission in mode k, and for absorption of photons from mode k, and $N_2$ is the population of the upper electronic level, $N_{1,v}$ is the population of vibrational level in the electronic state, and $\tau_k$ is the rate of photon loss from mode k, generally the rate at which light leaves the cavity as output.

By convention, $\beta_k$ is normalized such that $$\sum_k \beta_k = 1,$$

so that $N_2/\tau_{sp}$ is the total rate of spontaneous emission in all directions. Often, $\beta_k$ in the vertical mode, that is, the mode coupled to the desired light output, is small, at order 0.01 or smaller. Adding modes near the vertical, can total to about 20% of the light produced, with the remainder going into wave guide modes and transverse directions.

In the absence of stimulated emission, that is, when spontaneous emission is the dominant relaxation path, $\beta_k N_2/\tau_{sp} \gg g_k P_k (N_2 - N_{1,v})$ for all k, it is readily seen that light output from each mode is proportional to the excited state population, $$\frac{P_k}{\tau_k} = \beta_k \frac{N_2}{\tau_{sp}} \qquad \text{(Eq. 2)}$$

Thus, in order to increase output from spontaneous emission, the population of the excited state must be increased.

This is readily seen to be disadvantageous in several ways. Since this relation holds for all of the optical modes in the device, light losses increase proportionally with output. Where the excited state is subject to quenching, by charge or other interactions, efficiency decreases worse than linearly with output. And, where the excited state is reactive, degradation increases at least linearly with output.

Continuing with this simple model with two electronic states, charge density and the excited state population are related to each other and the electric current input by, $$\frac{\gamma}{eV} I = k_{eh} q^2 N_1 + \ldots = \frac{N_2}{\tau_{sp}} + \ldots \quad \text{(Eq. 3)}$$

where $\gamma$ is a factor for the recombination current, e is the unit electric charge, V is the effective volume, $k_{eh}$ is recombination rate constant, and charge balance is assumed, $q=[e]=[h]$, and the ellipses refer to a variety of loss and secondary processes. For our two level model, units can be chosen such that $N_1+N_2=1$. It is readily apparent that charge density for each of the carriers increases more rapidly than the excitation level, thus exacerbating quenching losses and efficiency roll-off.

The above situation is altered in a profound way when the stimulated emission term is the dominant path in any mode, $g_k P_k (N_2-N_{1,v}) \gg \beta_k N_2/\tau_{sp}$, for any mode k. In that case, our modal rate equations give us $$N_2 - N_{1,v} = \frac{1}{g_k \tau_k} \quad \text{(Eq. 4)}$$

so that the inversion level is constant and controlled by stimulated emission coefficient and the cavity lifetime. The Einstein A, B relations allows the expression of the stimulated emission coefficient in terms of the spontaneous emission lifetime and optical parameters, and using the relationship between Q and cavity lifetime yields $$N_2 - N_{1,v} = \frac{16\pi^2 c}{\lambda^4} \frac{\tau_{sp}}{Q^2} \quad \text{(Eq. 5)}$$

Under conditions where is sufficiently small, the relationship between current and light becomes to good approximation, $$\frac{\gamma}{eV} I = \frac{P_k}{\tau_k} + \frac{N_2^{(sat)}}{\tau_{sp}} \quad \text{(Eq. 6)}$$

where $N_2^{(sat)}$ is the gain saturated population. And the onset current for reaching gain saturation becomes $$\frac{\gamma}{eV} I \approx \frac{16\pi^2 c}{\lambda^4} \frac{1}{Q^2} \quad \text{(Eq. 7)}$$

Thus, for a suitably chosen emitter, positioned favorably (generally near an anti-node) in an optical configuration that provides a sufficiently large Q, the onset current is controlled largely by the wavelength and optical configuration.

Notably, where gain saturated results in a constant excitation level, charge carrier density increases slower than current and light output, $q \propto \sqrt{I}$.

Figure 4:
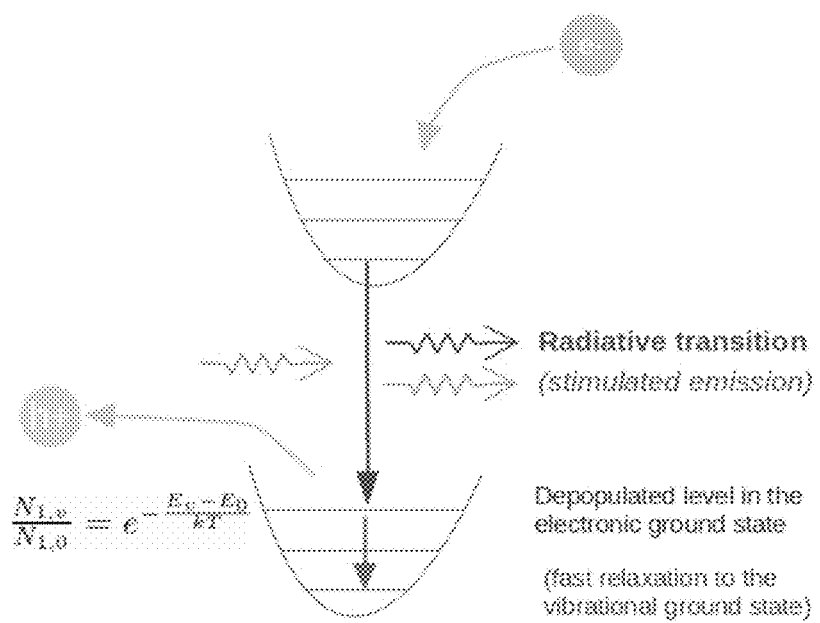
FIG. 4 is a schematic of radiative transition with stimulated emission, to a rapidly depopulated vibrational level in an electronic ground state.

An example of the type of stimulated emission process used in this invention is shown in FIG. 4. The radiative transition is from a the lowest vibrational level in an electronic excited state to a depopulated vibrational level in the ground state.

The population of the lower level of the radiative transition $N_{1,v}$ is related to the energy of that vibrational level above the lowest vibrational level as $$\frac{N_{1,v}}{N_{1,0}} = e^{-(E_{1,v}-E_{1,0})/k_b T} \quad \text{(Eq. 8)}$$

where for our application, $N_{1,0}$ is generally close to 1.

As an example, an emitter with emission to the lowest energy vibrational level at 436 nm, and a radiative transition emitting light at 497 nm, the energy difference is 340 meV, and the population of that vibrational level in the electronic ground state is about $10^{-6}$/molecule at room temperature.

Figure 5:
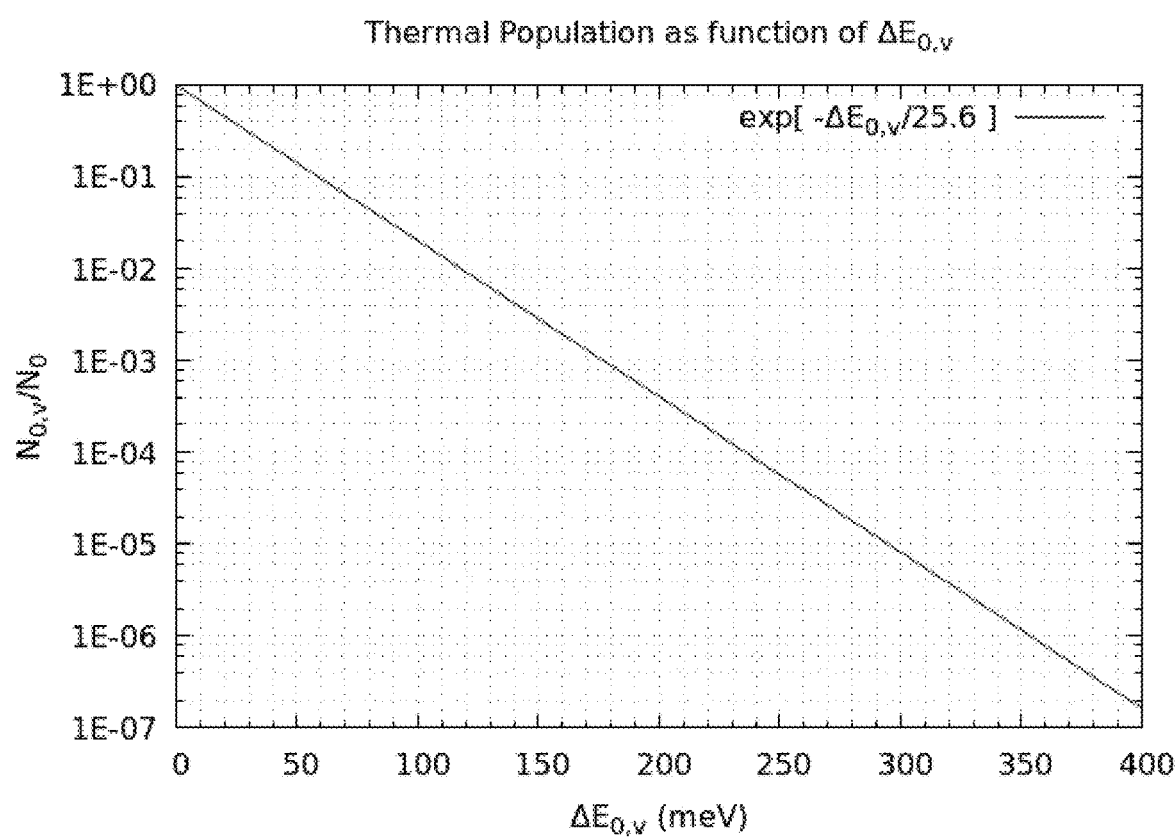
FIG. 5 is a plot of thermal population of a vibrational level at typical room temperate, as a function of $\Delta E_{0,v}$, the difference in energy between the vibrational level v, and the lowest vibrational level 0.
Figure 6:
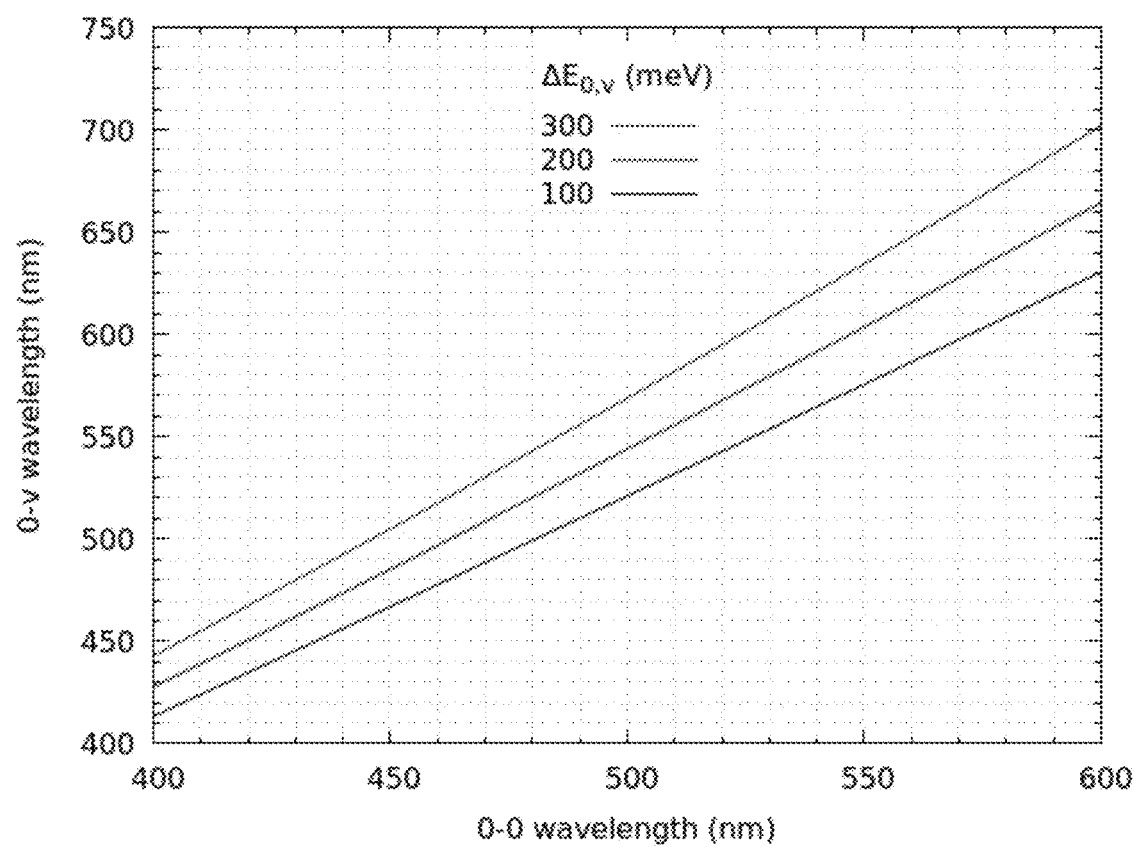
FIG. 6 is a plot of emission wavelength corresponding to a 0-v transition at a given $\Delta E_{0,v}$, and wavelength for the 0-0 transition.

For convenience, thermal population versus energy difference is graphed in FIG. 5. The wavelength of the transition to a higher vibrational level versus the wavelength of the 0-0 transition, for a given energy difference, is shown in FIG. 6.

The spectrum shown in FIG. 1 corresponds to Perylene. A wide variety of emitters are suitable including but not limited to, Rubrene, many of the fluorescent emitters, and many of the TADF emitters. Fluorescent emitters can be assisted by energy transfer from triplet dopants to scavenge recombination events. And, some triplet emitters can be used directly, where there is not photo-induced absorption or where the photo induced absorption path goes into gain saturated with or before the direct emission path transition to the ground state.

Further, the invention provides a means of enhancing the performance of TADF emitters by rapidly draining the singlet excited state population. In some TADF emitters, the triplet is in equilibrium with the singlet and is thereby drained as well. And, in some TADF emitters, the invention acts to attenuate forward crossing so that reverse crossing runs unopposed.

Specific Embodiments

The goals of the optical configuration are to reduce the population of the excited state $N_2$ in gain saturation to close to that of the lower level in the radiative transition, $N_{1,v}$. Therefore, Q is ideally wanted to be sufficiently large that the gain saturated fixed inversion level $N_2-N_{1,v}$ is similar to or smaller than $N_{1,v}$.

As Q is increased, the onset current density is reduced until the excited state population has been reduced to this level.

Figure 7:
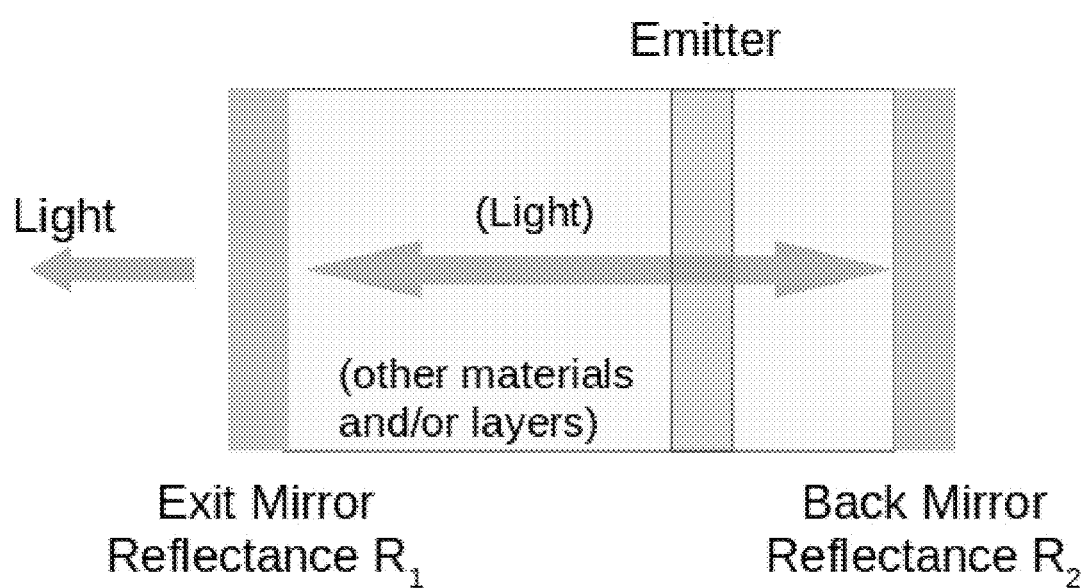
FIG. 7 is a schematic of general arrangement of reflective surfaces, internal materials or layers, including an emitter, such as in an OLED. Either or both mirrors may also serve as electrodes, or there may be one or more electrodes in other positions.

For purposes of illustration, consider the model cavity shown in FIG. 7, comprising two reflective surfaces oriented parallel to each other with an emitter located in between, generally at or in the vicinity of an antinode of a resonance of the cavity. It is understood that the space or a portion of the space between the two reflective surfaces can be occupied by an OLED or similar light emitting device.

Light exits the cavity through the exit mirror having reflectance $R_1$, while the back mirror has reflectance $R_2$. However, the invention can also be implemented with light exiting both mirrors. And the invention can also be implemented with light exiting neither mirror, for example instead being coupled to an adjacent resonator as is sometimes done in photonics.

The quality factor Q for such a cavity, with small absorption losses in the cavity, may be calculated by, $$Q = \frac{\eta L}{\lambda_0} \frac{2\pi}{-\ln(R_1 R_2)} \quad \text{(Eq. 9)}$$

where the leading term represents the optical length of the cavity divided by the free space wavelength, and the second term is the finesse F of the cavity. A useful understanding of these terms is that $Q=\lambda/\Delta\lambda$ and $F=\delta\lambda/\Delta\lambda$, where $\delta\lambda$ is the separation between resonances.

Figure 8:
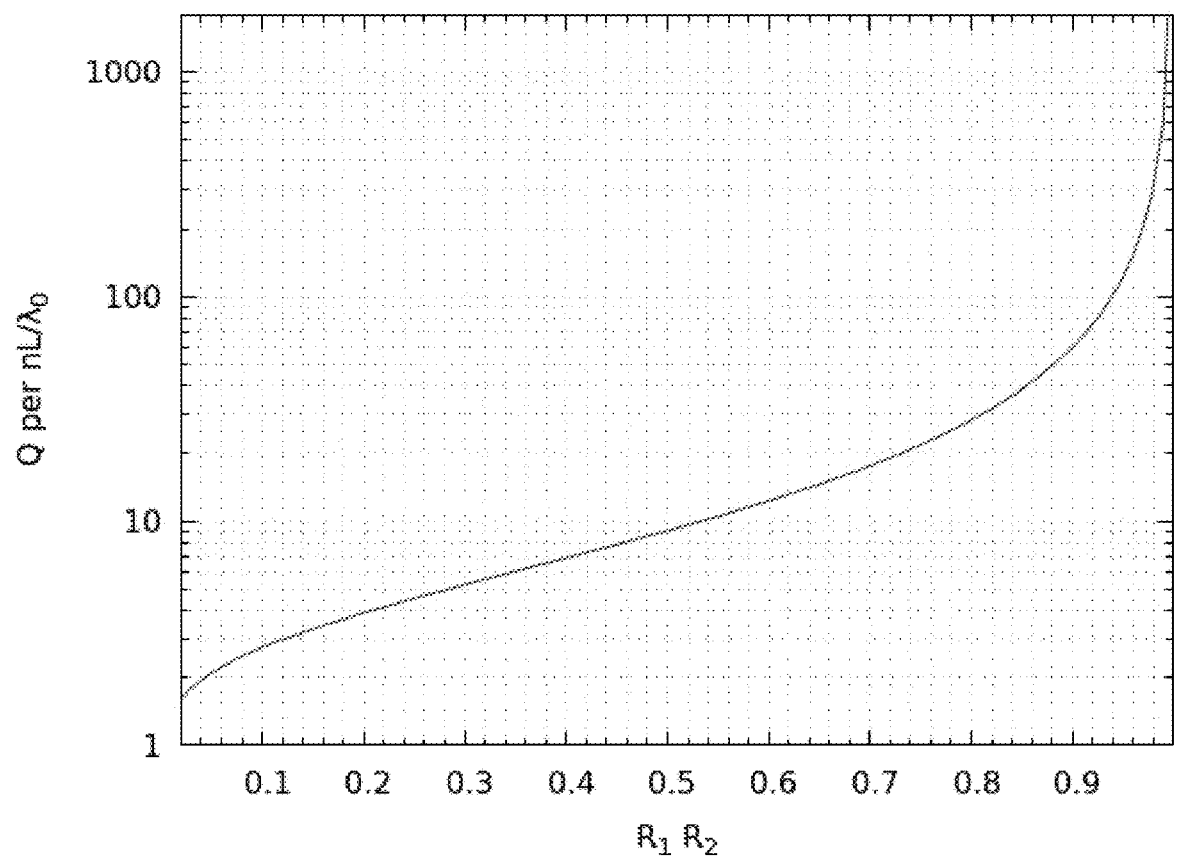
FIG. 8 is a plot of Q per cavity length divided by wavelength, as a function of the product of the reflectances of the two mirrors. Q falls of rapidly as the reflectance product goes from 0.99 to 0.85.

The relationship between Q and the product of the reflectances for a one wavelength cavity is shown in FIG. 8. Note that this is also the finesse. Q is in effect the finesse multiplied by the cavity length in number of wavelengths.

Note that the curve in FIG. 8 increases rapidly for a reflectance product above 0.9. In practice, Ag stands out as a good mirror with reflectance in the range 0.97, while Al has a comparatively lower reflectance in the range of 0.86.

Notably, a device with an 86% (or less) mirror and a one wavelength cavity has a Q under 50. Thus, devices with an Al mirror have inadequate Q for low onset, unless the cavity is significantly lengthened.

It should also be noted, that even in devices where one of the mirrors has a very high reflectance for example as might be provided by a distributed Bragg reflector (DBR), Q is still limited by the lower reflectance mirror and the cavity length. Several examples of devices with a DBR exit mirror and Al cathode as the back mirror, have appeared in the scientific literature dating to the early and mid 90's. None were capable of onset with a feasible input.

An important novelty of the present invention, compared to earlier devices, is that Q is increased by increasing cavity length, when either mirror does not provide very high reflectance sufficient to achieve sufficient Q.

Figure 9:
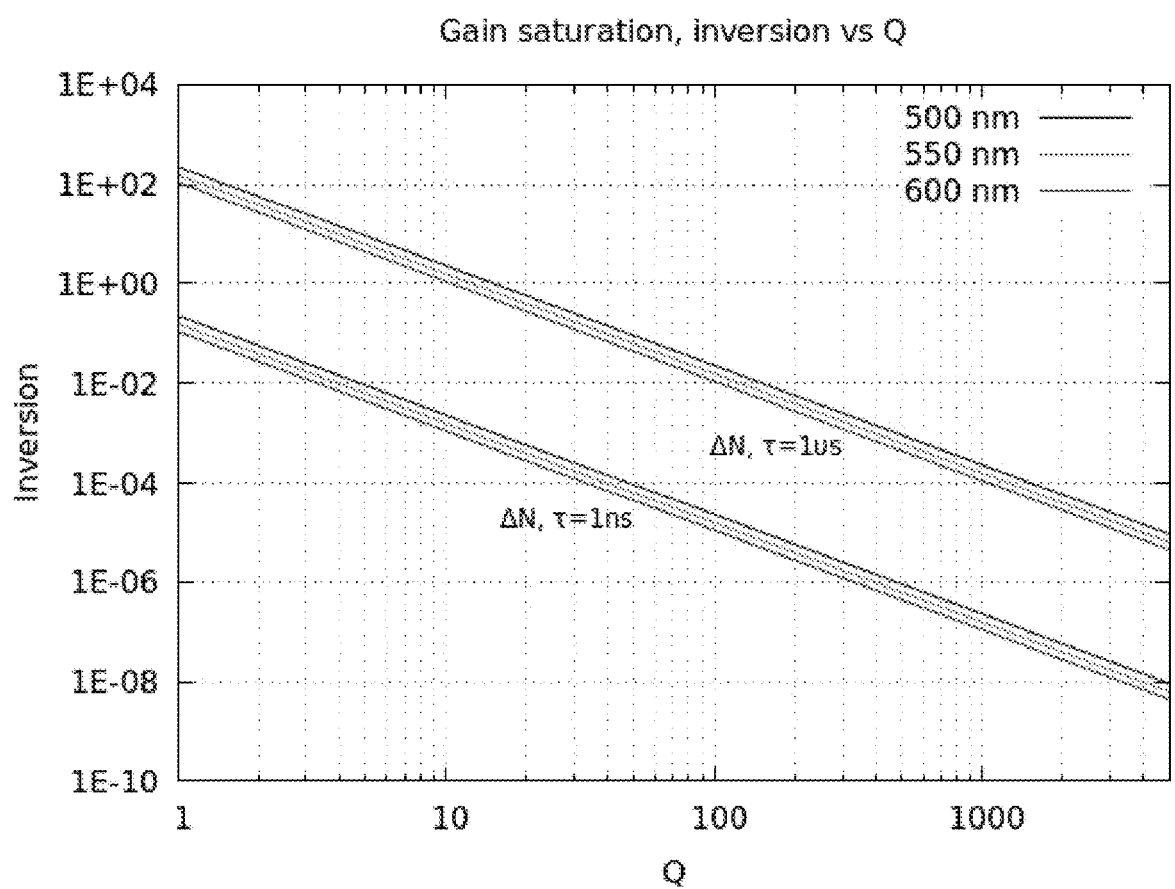
FIG. 9 is a plot of gain saturated inversion as function of Q for spontaneous emission time constants 1 ns and 1 us at three wavelengths.

The inversion population in gain saturation, as a function of Q, is shown for two values of the spontaneous emission rate, in FIG. 9. The selected values bracket the spontaneous emission rates of typical fluorescent emitters, while the slower value is in the range of some fast phosphorescent emitters.

Note that for our example with $N_{1,v'} \approx 10^{-6}$/molecule, and a spontaneous emission lifetime of about 4 ns, an ideal optical configuration would provide $Q \approx 1,000$.

As shown in Eq. 7, with the device engineered to provide onset of gain saturation with a sufficiently small excited state population, losses at onset can be small and the onset current density to reasonable approximation becomes a function of the wavelength, molecular dimensions (or effective volume), and optical configuration, that is, Q.

Figure 10:
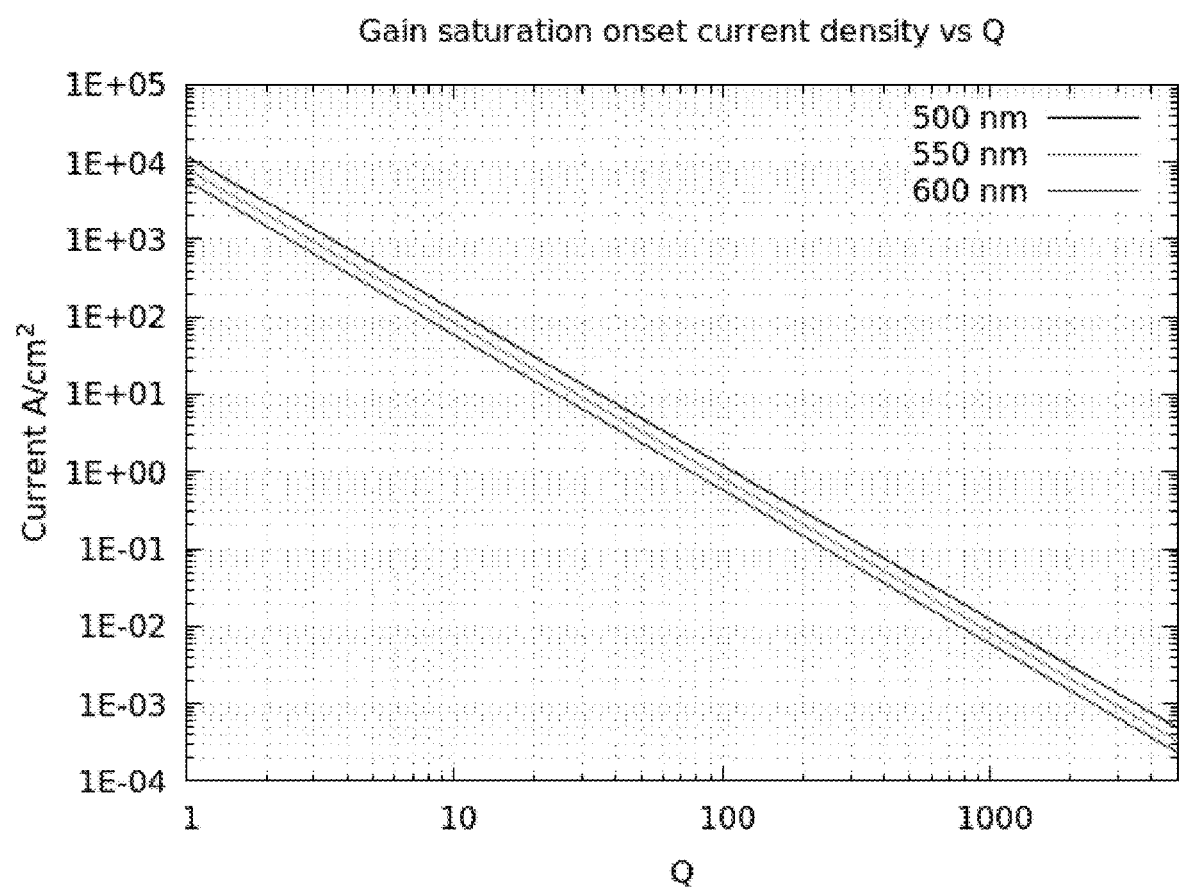
FIG. 10 is a plot of current density for low onset as a function of Q, at three wavelengths, for a typical sized OLED emitter molecule.

Onset current density as a function of Q for three different wavelengths assuming typical molecular size of common OLED emitters, is shown in FIG. 10. A Q of 1,000 can provide an onset current density in the range of 10 mA/cm$^2$.

It might be noted in these examples that a larger Q will not significantly further reduce the gain saturated excited state population or onset current, since the lower bound on $N_2$ is set by the population of the vibrational level in the lower electronic state, $N_{1,v'}$.

Also, the efficiency of the device, apart from losses in the exit mirror is set by the energy of the operating transition divided by the 0-0 transition. Thus there is a small trade off between onset current or excited state population, and efficiency.

Consequently, values of Q sufficient to achieve low onset are not readily supplied by a simple arrangement of metal mirrors in a one wavelength or half wavelength cavity. Thus, devices described in the literature, or otherwise known to date, are not sufficient to achieve this goal.

In the following, OLED stack refers to any set of layers or layer, functioning in combination with electrodes as an electroluminescent device. For example, OLED stack may refer to a set of layers comprising a hole injection layer, a hole transport layer, an emitter layer, an electron transport layer, and an electron injection layer, which in addition to the electrodes, functions as an OLED. OLED stack can also refer to a single layer device where one layer provides all of the functions.

In all of the following, optimal operation is obtained with an emitting region located in the vicinity of an antinode.

In the following, multiples of the resonant wavelength will refer to an optical length that is a multiple of the resonant wavelength in steps of half wavelength, i.e. 1λ, 1½λ, 2λ, 2½λ, etc.

In the following, configurations are shown as bottom emitting devices. However it will be readily understood that the intended range of devices claimed in this invention includes the top emitting versions of each of these devices, where the reflectivities of the mirrors are simply reversed, or the mirror positions are reversed, along with optical transition layers as appropriate.

Moreover, claimed configurations include, without limitation, all of the following where the top electrode is the cathode and the bottom is the anode, and also the reverse where the top electrode is the anode and the bottom electrode is the cathode.

Figure 11:
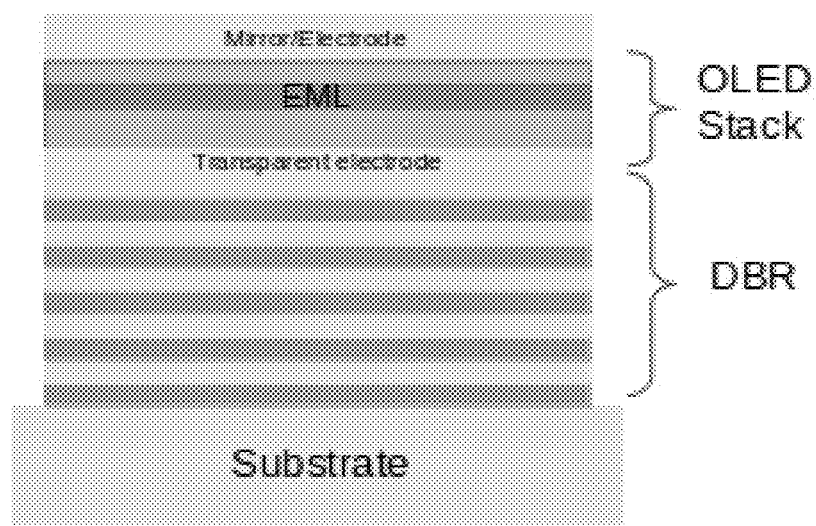
FIG. 11 is a schematic of an embodiment comprising an OLED stack, sandwiched between a back mirror/electrode and a transparent electrode and dielectric mirror, such as a distributed Bragg reflector (DBR), functioning as the exit mirror. The emitter layer is chosen to the criteria of this invention, and positioned at or in the vicinity of an antinode, and the cavity length is tuned to the intended operating wavelength. With a Ag back mirror/electrode and sufficient reflectance of the exit mirror, a cavity length of one or two wavelengths resonant with an appropriate transition can provide onset at low current density.

FIG. 11 shows an embodiment in schematic comprising an OLED stack sandwiched between a electrode serving also as a back mirror and a transparent electrode and DBR serving as an exit mirror, all residing on a substrate. In order to function as a low onset device, this configuration requires (a) resonance with a suitable emission line of a suitable emitter, as noted above, and (b) a combination of mirror reflectance and cavity length that provides sufficient Q for low onset. For most available back mirror materials, the Q will be limited by the back mirror, and so the thickness of one or more layers within the OLED stack is increased to set the cavity length equal to one or more multiples of the resonance to achieve sufficient Q. A top emitting version of this device corresponds to either the device as shown with a partially transmitting top mirror, or the device in reverse with the electrode mirror layered on the substrate and the transparent electrode and DBR layered on top of the OLED stack.

Figure 12:
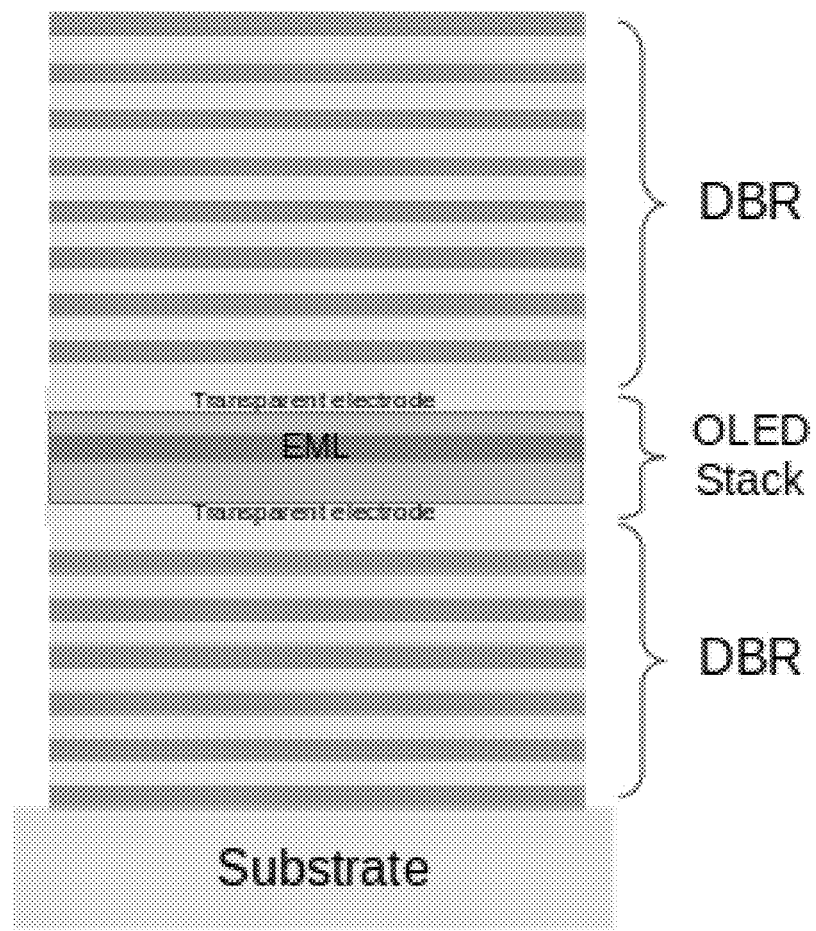
FIG. 12 is a schematic of an embodiment comprising an OLED stack, sandwiched between a transparent electrode and DBR back mirror, and a transparent electrode and DBR exit mirror. The emitter layer is chosen to the criteria of this invention, and positioned at an antinode, and the cavity length is tuned to the intended operating wavelength. High reflectivity low loss DBR mirrors with a cavity length of even half a wavelength can provide onset at low current density.

FIG. 12 shows an embodiment comprising two high reflectance distributed Bragg reflectors (DBR), which could be dielectric mirrors in general, with an OLED stack and transparent electrodes sandwiched between. DBR's can be made with reflectance in the range of 0.99, and so this can provide a sufficiently high Q such that when tuned to resonance with a suitable emission line of a suitable emitter, low onset is obtained. Notably, lower reflectance can be used, by using a cavity length that is a higher multiple of the desired resonant wavelength.

Figure 13:
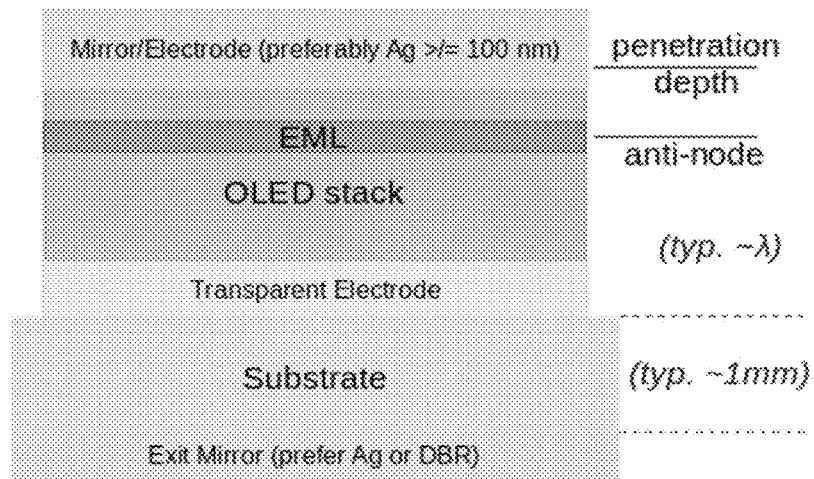
FIG. 13 is a schematic of an embodiment comprising an OLED stack, sandwiched between a back mirror/electrode and transparent electrode, substrate and exit mirror at the external side of the substrate. The emitter layer is chosen to the criteria of this invention, and positioned at an antinode. The extra long cavity provides a Q as high as order million depending on the choice of back mirror and exit mirror and thickness of the substrate. Ag compared to other metals, and dielectric mirrors generally have low losses relative to the transmitted light, and so are preferred. Metal mirrors as a practical matter, generally require a capping layer.

FIG. 13 shows an embodiment comprising a back mirror serving as an exit mirror at the bottom of the substrate. The thickness of the substrate makes this effectively a macro cavity device with a Q in the range of 10$^6$, far in excess of the requirements of most emitter configurations. However, good reflectance is still preferred in order to provide adequate finesse and thereby, distinct resonances. Nonetheless, even the glass air interface at the exit, combined with a Ag back mirror, is sufficient to provide a finesse of 1. As in all devices, the emitter is to be located near or in the vicinity of an antinode of the desired operating wavelength. The kinetics of gain saturation then selects the optimal wavelength within the range available to the position of the emitter.

Figure 14:
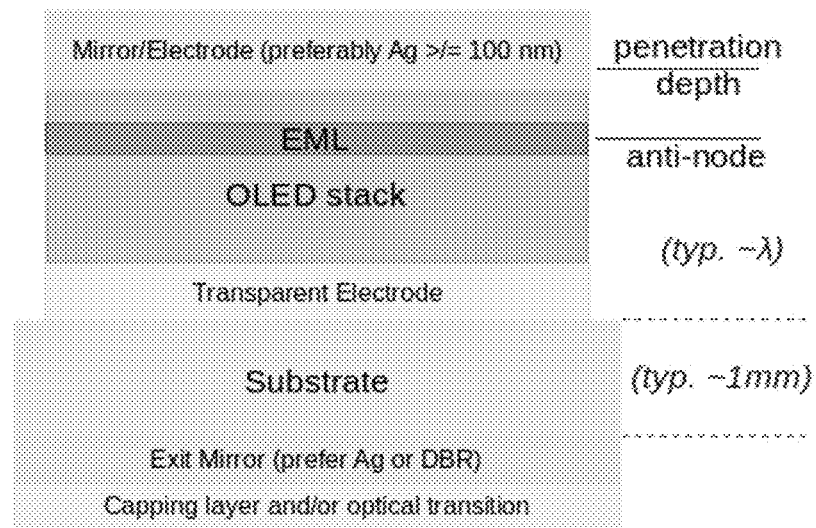
FIG. 14 is a schematic of the embodiment shown in FIG. 13, with addition of an optical transition layer, or a capping layer that can also be an optical transition layer. The use of an optical transition layer provides enhanced efficiency for transmitted light through the partially reflective exit mirror.

FIG. 14 shows a similar embodiment as that of FIG. 13, but with the addition of a layer that serves as an optical transition for the exit mirror. This serves to increase the efficiency of the output relative to losses as light passes through the exit mirror.

Figure 15:
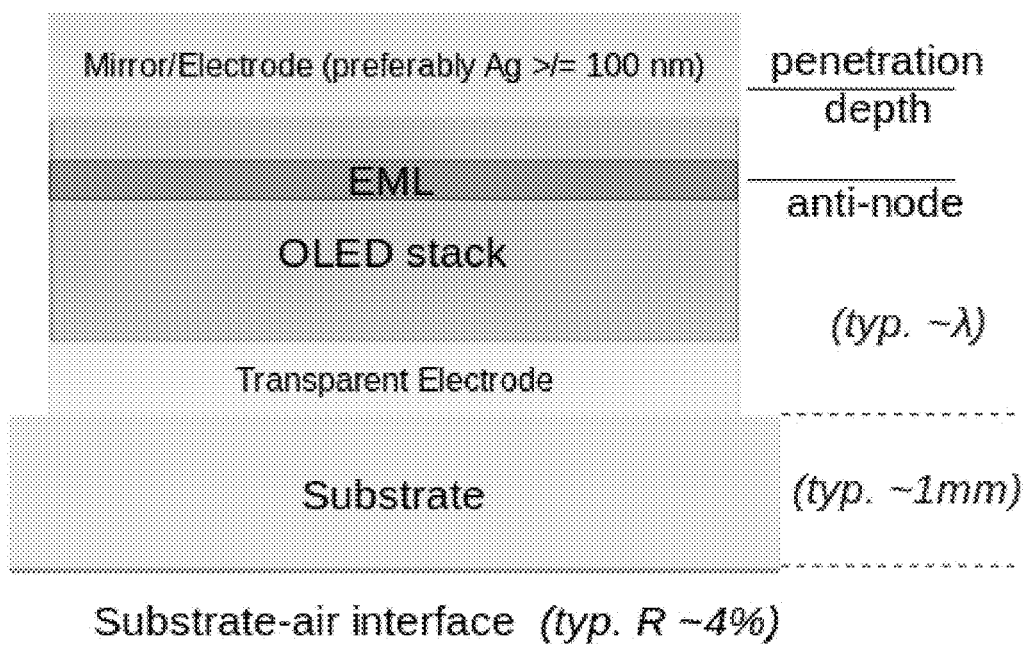
FIG. 15 is a schematic of the embodiment shown in FIG. 13, with exit mirror formed by the substrate air interface.

FIG. 15 shows a similar embodiment as that of FIG. 13, but where the exit mirror is formed by the interface between the substrate and the ambient. Where the substrate is glass and the ambient is air, the resulting finesse is generally better than 1, thus providing a high Q device capable of onset when configured with an appropriate emitter.

Figure 16:
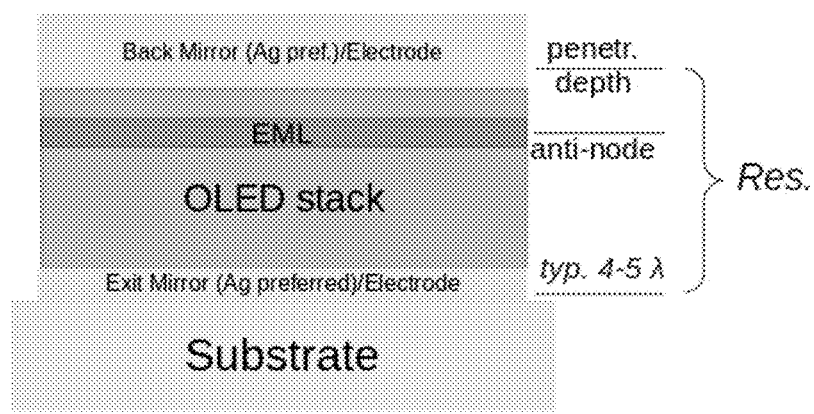
FIG. 16 is a schematic of an embodiment comprising an OLED stack, sandwiched between a back mirror/electrode and partial mirror electrode. The emitter layer is chosen to the criteria of this invention, and positioned at an antinode. With Silver (Ag) mirrors, a cavity of several wavelengths can provide a Q of several hundred and achieve moderately low onset.

FIG. 16 shows an embodiment where the cavity is formed by two mirrors and the cavity length is set to a somewhat larger multiple of the resonant wavelength to accommodate the lower reflectance of conventional mirrors, for example as compared to the DBRs in the first and second examples. At 4-5 multiples of a wavelength, the device can provide sufficient Q to bring the onset current below 100 mA.

Figure 17:
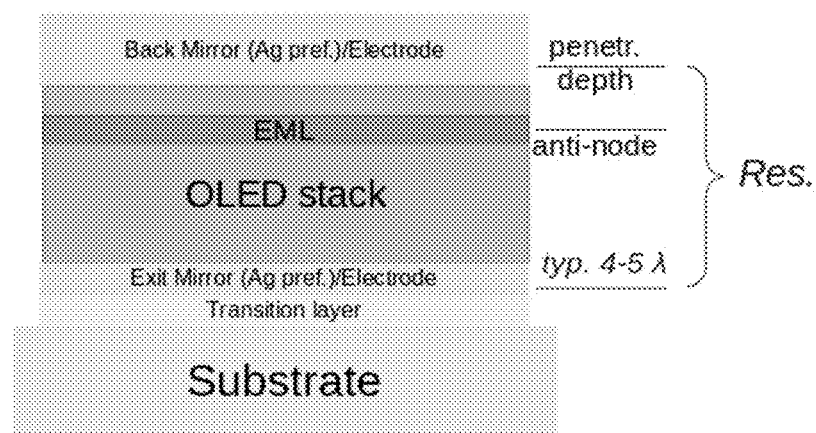
FIG. 17 is a schematic of the embodiment shown in FIG. 16, with addition of an optical transition layer. The use of an optical transition layer provides enhanced efficiency for transmitted light through the partially reflective exit mirror.

FIG. 17 shows an embodiment similar to that of FIG. 16, in which an optical transition layer is added below the exit mirror. As in FIG. 14, this increases the efficiency of the output relative to losses passing through the mirror.

Suitable materials for the transition layer include but are not limited LiF, NPB, Alq3.

It is understood that in the above, the illustrated embodiments are schematic and apply to a wide variety of materials and dimensions. Further, techniques and equipment needed to fabricate OLEDs according to these schematic embodiments are well known in the prior art.

Although this invention has been described with a certain degree of particularity, it is to be understood that the present disclosure has been made only by way of illustration and that numerous changes in the details of construction and arrangement of parts may be resorted to without departing from the spirit and scope of the invention.

What is claimed is:

1. An electroluminescent device comprising:
   (a) a positive electrode;
   (b) a negative electrode;
   (c) an emissive layer being able to emit emitted radiation by spontaneous emission, the emissive layer being in operational contact with the positive electrode and the negative electrode;
   the emissive layer having a radiative transition to a depopulated level, thereby being able to produce light by a gain saturated emission ("GSE").

2. The electroluminescent device as described in claim 1, further comprising:
   (d) a first reflective surface located at a first side of the emissive layer,
   (e) a second reflective surface located at a second side of the emissive layer opposite to the first side, and
   (f) a cavity between the first and second reflective surfaces, the cavity having a cavity length, the cavity length being resonant with the radiative transition.

3. The electroluminescent device as described in claim 2, wherein the emissive layer comprises a material, the first reflective surface has a first reflectance, the second reflective surface has a second reflectance, the GSE having an onset; and whereby an operational combination of
   (i) the material,
   (ii) the first reflectance, and
   (iii) the second reflectance at the GSE onset
results in a small inversion level.

4. The electroluminescent device as described in claim 3, in which the emissive layer is located near an antinode within the cavity.

5. The electroluminescent device as described in claim 3, in which the material is selected to substantially avoid absorption by the material of the emitted radiation.

6. The electroluminescent device as described in claim 4, in which the material is selected to substantially avoid absorption by the material of the emitted radiation.

7. The electroluminescent device as described in claim 3, whereby an operational combination of
   (i) the material,
   (ii) the first reflectance,
   (iii) the second reflectance, and
   (iv) the cavity length
results in a low current density at the GSE onset.

8. The electroluminescent device as described in claim 3, whereby an operational combination of
   (i) the material,
   (ii) the first reflectance,
   (iii) the second reflectance, and
   (iv) the cavity length
results in a small inversion level at the GSE onset.

9. The electroluminescent device as described in claim 3, whereby an operational combination of
   (i) the material,
   (ii) the first reflectance,
   (iii) the second reflectance, and
   (iv) the cavity length at the GSE onset
results in a low current density at the GSE onset.

10. The electroluminescent device as described in claim 1, wherein the GSE is with low onset.

11. The electroluminescent device as described in claim 2, wherein:
   the GSE is with low onset; and
   the cavity length is a multiple of a one-half optical wavelength.

* * * * *